HIGH-FREQUENCY TUNNEL DIODE CIRCUIT

Filed Sept. 14, 1961

INVENTOR
ALBERT SCHMITZ
BOUDEWIJN BOLLEE
BY
Frank R. Trifari
AGENT

United States Patent Office 3,140,452
Patented July 7, 1964

3,140,452
HIGH-FREQUENCY TUNNEL DIODE CIRCUIT

Albert Schmitz and Boudewijn Bollee, Eindhoven, Netherlands, assignors to North American Philips Company, Inc., New York, N.Y., a corporation of Delaware
Filed Sept. 14, 1961, Ser. No. 138,109
Claims priority, application Netherlands Sept. 28, 1960
9 Claims. (Cl. 331—101)

The invention relates to tunnel diode high-frequency circuits.

In high-frequency circuit arrangements, the problem frequently arises of preventing the supply circuit from influencing the behaviour of the high-frequency circuit. This applies particularly to circuit arrangements including tunnel diodes. It is true that, similarly to what is in common use, for example in circuit arrangements using electron tubes, smoothing or bypass capacitors and choke coils may be used, however, special steps must be taken to ensure that the capacitance of the smoothing capacitor or the inductance of the choke and/or the supply leads of the direct-voltage source do not give rise to parasitic oscillations. It can be shown that the smoothing capacitor for mean values of the quantities characteristic of a tunnel diode has to be a few thousands of picofarads, for example 2000 pf., in order to counteract low-frequency parasitic oscillations. Although 2000 pf. in itself is not an excessive capacitance—a ceramic capacitor of this order of magnitude can be manufactured comparatively readily—the inductance of the supply leads to, and the proportions of, the ceramic capacitors provide difficulty. It can be calculated that at frequencies of 1000 mc./s. and higher, the series inductance of the high-frequency circuit, which apart from the internal inductance of the tunnel diode at least comprises the inductance of the supply leads for the (ceramic) smoothing capacitor, should not exceed a value of about 0.5 nh. The inductance of commercially available ceramic capacitors, however, is near 5 nh., so that these capacitors cannot be used. With a mica capacitor comprising a mica plate 5 microns thick and having a surface area of 2 $cm.^2$ on which silver electrodes are deposited from vapour, a capacitance of 2000 pf. is obtained, which may be used in an oscillator or amplifier including a tunnel diode and operating in the frequency range of 1000 mc./s. However, the construction of the oscillator (or amplifier) has to be adapted to the comparatively large capacitor having comparatively little inductance.

A further requirement to be satisfied by circuit arrangements including tunnel diodes consists in that in order to obtain a stable direct-voltage adjustment of the tunnel diode, the overall resistance of the external circuit connected to the diode terminals has to be smaller than the absolute value of the (negative) differential resistance in the steepest part of the static current-voltage characteristic of the tunnel diode.

According to the invention, both requirements—smoothing capacitors having little inductance, and a low external resistance of the tunnel diode—can be satisfied by connecting an additional p-n-junction to a supply source so that it has a low resistance and a comparatively large parallel capacitance, the direct-voltage adjustment of the tunnel diode being derived from this additional p-n-junction. The additional p-n-junction is to be considered as a rectifier having a small resistance and a large parallel capacitance in the conductive direction.

In particular, the tunnel diode and the additional p-n-junction may be provided in closest proximity on a single semi-conductor body. It should be noted that the provision of several p-n-junctions on a single semi-conductor body is known.

According to a further feature of the invention, the semi-conductor body consists of p-germanium, the tunnel diode of a pellet of tin arsenide (SnAs) alloyed to the p-germanium at a comparatively low temperature and the additional p-n-junction of a pellet of bismuth arsenide (BiAs) alloyed to the germanium at a comparatively high temperature.

In order that the invention may readily be carried out, an embodiment thereof will now be described, by way of example, with reference to the accompanying drawing, in which.

Figure 1:
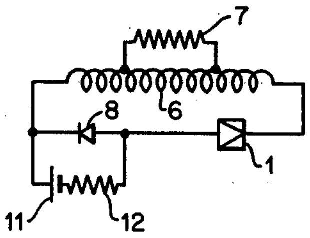
FIGURE 1 is a schematic diagram of a device according to the invention.
Figure 2:
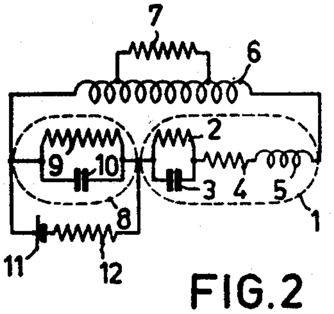
FIGURE 2 is an equivalent circuit of the circuit of FIGURE 1.

In the range in which a tunnel diode 1 of FIG. 1 operates as an oscillator or amplifier, it may be considered as comprising a series connection of a stray resistance 4, an internal inductance 5 and a parallel combination of a negative resistance 2 and a capacitor 3 (FIGURE 2). The impedances 2–5 may have the following values: 2=−10 ohms, 3=10 pf., 4=1 ohm, 5=0.15 nh. The inductance 6 which together with the inductance 5 and the capacitance 3 forms a tank circuit is partly bridged by the load resistance 7. It is directly seen that the static adjustment of the tunnel diode 1 is not influenced by the load resistance 7. An additional p-n-junction 8 (FIGURE 1) may be considered as a rectifier having a small resistance 9 and a large parallel capacitance 10 in the conductive direction (FIGURE 2). The resistance 9 may have a value of about 5 ohms, so that the stability condition (the sum of the resistances 9 and 4 has to be smaller than the absolute value of the resistance 2) is satisfied. The capacitance 10 may have a value of about 5000 pf. The series connection of a supply source 11 and a resistance 12, which need not have a small inductance value, is connected in parallel with the additional p-n-junction 8 and—with respect to the static adjustment—also with the tunnel diode 1. The supply source 11 is connected with a polarity such that the tunnel diode 1 is operated in the forward direction. At the same time, by a suitable choice of the electrode materials of the tunnel diode 1 and of the additional p-n-junction 8, the latter is operated in the conductive direction, the resistance 9 actually assuming a value of about 5 ohms and the capacitance 10 assuming a value of about 5000 pf.

Figure 3:
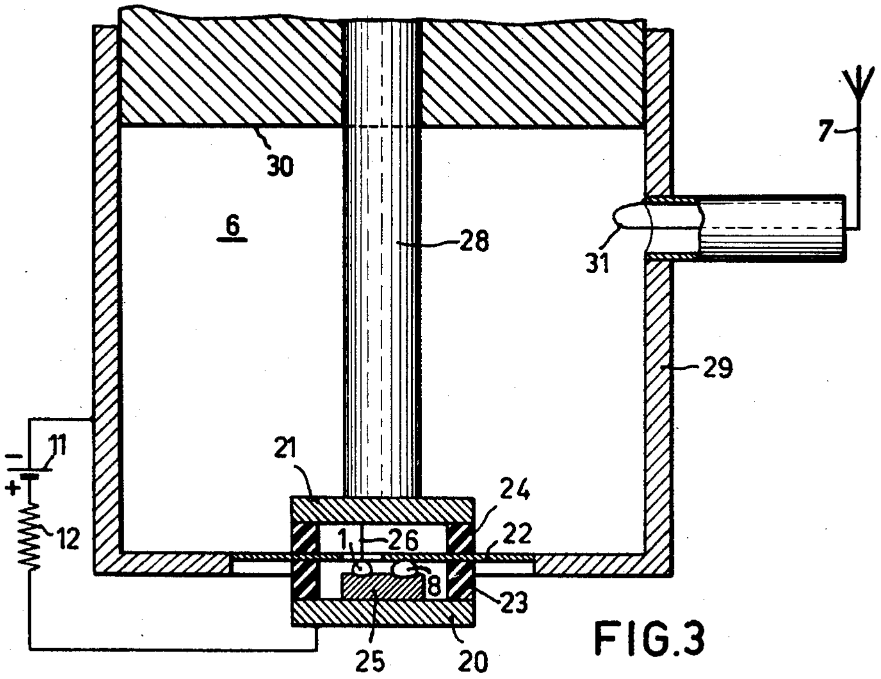
FIGURE 3 is a constructional solution.

In the embodiment of the invention shown in FIGURE 3, the tunnel diode 1 is provided on a wafer 25 of p-germanium having a diameter of about 1.5 mm. and a thickness of about 0.2 mm., by alloying a pellet of tin arsenide to the wafer 25 at a comparatively low temperature (for example 450° C.) after the provision of the additional p-n-junction 8 by alloying a pellet of bismuth arsenide to the wafer 25 at a comparatively high temperature (for example 650° C.). The spacing between the pellets is very small, i.e. a few tenths of a millimeter. The wafer 25 is secured to a base plate 20. A plate 22 makes contact with the p-n-junction 8, and an upper plate 21 makes contact with the tunnel diode 1 through a thin lead 26 having a length of, for example, 0.5 mm. The plates 20, 21 and 22, which are made of conductive material, are spaced in sharply defined relative positions with the aid of ceramic annular spacers 23 and 24. For this purpose, the ceramic spacers 23 and 24 may be cemented to the plates 20, 21 and 22 by means of synthetic resin. The direct voltage produced by the series combination of the supply source 11 and the resistance 12 is set up between the plates 20 and 22 so that the plate 20 is positive with respect to the plate 22 and consequently the p-n-junction 8 is conductive. The plates 22 and 21 are connected to one another for direct current through the high-frequency circuit 6 enabling the static adjustment of the tunnel diode 1 (through the lead 26) to be effected.

The high-frequency circuit 6 is designed as a coaxial line comprising an inner conductor 28 and an outer conductor 29 and closed by a movable piston 30. Through a coupling loop 31 the high-frequency energy is supplied to the load 7. If required, the loop 31 together with the load 7 may be moved in a direction parallel to the axis of the coaxial line, and this may facilitate the desired high-frequency adjustment.

The high-frequency circuit 6 may alternatively be a so-called strip line instead of a coaxial line.

What is claimed is:

1. A high-frequency circuit arrangement comprising a tunnel diode, an additional semiconductor diode comprising a p-n-junction, a supply voltage source, means connecting the additional diode to the voltage source so as to bias its junction in the forward direction whereby the additional diode exhibits a low resistance but a comparatively large parallel capacitance, and a load coupled in series with the tunnel diode across the additional diode in such manner that the direct-current voltage applied across the tunnel diode to bias it in the forward direction is controlled by that existing across the additional diode.

2. A high-frequency circuit as set forth in claim 1 wherein the tunnel diode and additional diode are constructed on a single block of semiconductive material.

3. A stable high-frequency circuit arrangement comprising a tunnel diode having a given value of negative resistance and an equivalent comparatively low capacitance, an additional semiconductor diode comprising a p-n-junction, a load, and a supply voltage source, means connecting the additional diode to the voltage source so as to bias its p-n-junction in the forward direction whereby the additional diode exhibits a resistance substantially smaller than the absolute value of the tunnel diode negative resistance but a comparatively large parallel capacitance much larger than the equivalent capacitance of the tunnel diode, and means connecting the tunnel diode through the load to the additional diode in such manner that the direct-current voltage applied across the tunnel diode to bias it in the forward direction is substantially equal to that existing across the additional diode.

4. A circuit as set forth in claim 3 wherein the tunnel diode and additional diode are constructed in close proximity on a single body of semiconductive material.

5. A circuit as set forth in claim 4 wherein the semiconductive body is of p-type germanium, the tunnel diode comprises an alloyed electrode of tin arsenide, and the additional diode comprises an alloyed electrode of bismuth arsenide.

6. A circuit as set forth in claim 4 wherein the body is secured to a first conductive plate, a second conductive plate is connected to the additional diode, and a third conductive plate is connected to the tunnel diode.

7. A stable high-frequency circuit arrangement for frequencies at least equal to those in the UHF band, comprising a tunnel diode having a given value of negative resistance and an equivalent comparatively low capacitance, an additional semiconductor diode comprising a p-n-junction in close proximity to the tunnel diode, a load, a source resistance, and a supply voltage source, means connecting the additional diode to the voltage source through the source resistance so as to bias its p-n-junction in the forward direction whereby the additional diode exhibits a resistance substantially smaller than the absolute value of the tunnel diode negative resistance but a comparatively large parallel capacitance much larger than the equivalent capacitance of the tunnel diode, and means connecting the tunnel diode through inductive coupling to the load and to the additional diode in such manner that the direct-current voltage applied across the tunnel diode to bias it in the forward direction is substantially equal to that existing across the additional diode.

8. A circuit as set forth in claim 7 wherein the means connecting the tunnel diode includes a tank circuit.

9. A circuit as set forth in claim 8 wherein the tank circuit includes a coaxial line.

References Cited in the file of this patent

UNITED STATES PATENTS

| | | |
|---|---|---|
| 3,018,423 | Aarons et al. | Jan. 23, 1962 |
| 3,040,186 | Duzer | June 19, 1962 |

OTHER REFERENCES

Application Engineering Notes (published by Hughes Semiconductor Division), May 1960, "Tunnel Diode Applications," Todd, 8 pages (only FIG. 12 on page 5 relied upon).